(12) United States Patent
Wade

(10) Patent No.: US 7,808,628 B1
(45) Date of Patent: Oct. 5, 2010

(54) METHOD FOR NANOSCALE SPATIAL REGISTRATION OF SCANNING PROBES WITH SUBSTRATES AND SURFACES

(75) Inventor: Lawrence A. Wade, La Canada-Flintridge, CA (US)

(73) Assignee: California Institute of Technology, Pasadena, CA (US)

( * ) Notice: Subject to any disclaimer, the term of this patent is extended or adjusted under 35 U.S.C. 154(b) by 1054 days.

(21) Appl. No.: 11/472,596

(22) Filed: Jun. 21, 2006

Related U.S. Application Data

(63) Continuation of application No. 11/372,475, filed on Mar. 8, 2006, now abandoned.

(60) Provisional application No. 60/659,552, filed on Mar. 8, 2005.

(51) Int. Cl.
*G01B 11/26* (2006.01)

(52) U.S. Cl. .................. 356/153; 250/234; 250/309; 250/307; 427/402; 435/6

(58) Field of Classification Search .............. 356/153; 250/234, 309, 458.1, 307; 427/402
See application file for complete search history.

(56) References Cited

U.S. PATENT DOCUMENTS

| | | | | |
|---|---|---|---|---|
| 5,166,516 A | * | 11/1992 | Kajimura | 250/234 |
| 5,894,122 A | * | 4/1999 | Tomita | 250/234 |
| 5,986,256 A | * | 11/1999 | Yagi | 250/234 |
| 5,994,691 A | * | 11/1999 | Konada | 250/234 |
| 6,642,517 B1 | * | 11/2003 | Ghislain et al. | 250/306 |
| 6,911,646 B1 | * | 6/2005 | Weitekamp | 250/234 |
| 6,953,927 B2 | * | 10/2005 | Quake et al. | 250/234 |
| 7,211,795 B2 | * | 5/2007 | Collier et al. | 250/307 |
| 2004/0089816 A1 | * | 5/2004 | Quake et al. | 250/458.1 |

* cited by examiner

*Primary Examiner*—Tarifur R. Chowdhury
*Assistant Examiner*—Isiaka O Akanbi
(74) *Attorney, Agent, or Firm*—Townsend and Townsend and Crew LLP

(57) ABSTRACT

Embodiments in accordance with the present invention relate to methods and apparatuses for aligning a scanning probe used to pattern a substrate, by comparing the position of the probe to a reference location or spot on the substrate. A first light beam is focused on a surface of the substrate as a spatial reference point. A second light beam then illuminates the scanning probe being used for patterning. An optical microscope images both the focused light beam, and a diffraction pattern, shadow, or light backscattered by the illuminated scanning probe tip of a scanning probe microscope (SPM), which is typically the tip of the scanning probe on an atomic force microscope (AFM). Alignment of the scanning probe tip relative to the mark is then determined by visual observation of the microscope image. This alignment process may be repeated to allow for modification or changing of the scanning probe microscope tip.

12 Claims, 5 Drawing Sheets

METHOD FOR NANOSCALE SPATIAL REGISTRATION OF SCANNING PROBES WITH SUBSTRATES AND SURFACES

CROSS-REFERENCES TO RELATED APPLICATIONS

This application claims priority to U.S. Provisional patent application No. 60/659,552 filed Mar. 8, 2005, commonly assigned and incorporated by reference herein for all purposes.

STATEMENT AS TO RIGHTS TO INVENTIONS MADE UNDER FEDERALLY SPONSORED RESEARCH OR DEVELOPMENT

Work described herein was carried out at the Jet Propulsion Laboratory, California Institute of Technology under a contract with the National Aeronautics and Space Administration (NASA), and funded through the internal Research and Technology Development program. The United States Government may therefore have certain rights in the invention.

BACKGROUND OF THE INVENTION

Chemically functional nanoscale devices such as sensors are typically built up in a series of steps. Such steps may include writing a chemical or protein ink onto a substrate to provide a new or different functionality, electro-chemical modification of an already deposited substance, or manipulation of a nanoscale object or material. These steps are often performed in sequence with a need to modify the characteristics of, or change or replace, the scanning probe that is being used, before proceeding on to the next step. After such modification or change to the scanning probe, it must be repositioned with sufficient accuracy on the substrate to allow the next step in the process to be performed.

One example of such a patterning process is the use of Dip-Pen Nanolithography (DPN) to fabricate sensor arrays or molecular circuits. Dip-Pen Nanolithography (DPN) is a direct-write printing technique that uses chemically modified AFM tips to pattern biological materials on a variety of substrates at the nanoscale level. DPN is discussed in detail by Ginger et al. in "The Evolution of Dip-Pen Nanolithography", *Angew. Chem. Int. Ed.* 43, 30-45 (2004), which is incorporated by reference herein for all purposes.

There are numerous examples of chemical and biological materials that can be patterned at resolution better than 100 nm, and in the best case, as high as 15 nm, a length scale that is on the order of the dimensions of individual biological macromolecules. For example, Hong et al. describe such patterning in Multiple Ink Nanolithography: "Toward a Multiple-Pen Nano-Plotter", *Science* 286, 523 (1999), which is also incorporated by reference herein for all purposes. Interactions of immobilized proteins with ligands, antibodies or other molecules fundamentally change many of the physical properties of features at this small length scale, such as shape and size, which allows for the development of new screening strategies based on standard AFM imaging.

Another application that calls for precise alignment or registration of a probe tip with the surface of a substrate, is the fabrication of large scale sensing and processing arrays, such as those proposed as a lab-on-a-chip. Again, fabrication of such an array of sensors or nanodevices to form chemical, molecular, or electrical circuits with highly accurate spatial patterning and highly specific functionality, requires frequent modification and periodic replacement of the AFM probe tip being used for writing. Therefore, it is necessary to rapidly, repeatedly, and reliably return the AFM probe(s) to the same location so that the sequential patterning steps can be performed with sufficient precision.

Therefore, improved techniques for spatial alignment or registration of nanoscale probes with surfaces are highly desirable.

BRIEF SUMMARY OF THE INVENTION

Embodiments in accordance with the present invention relate to methods and apparatuses for aligning a scanning probe used to pattern a substrate, by comparing the position of the probe to a reference location or spot on the substrate. A first light beam is focused on a surface of the substrate as a spatial reference point. A second light beam then illuminates the scanning probe being used for patterning. An optical microscope images both the focused light beam and the shadow or diffraction pattern of the illuminated scanning probe tip of a scanning probe microscope (SPM), which is typically the tip of the scanning probe on an atomic force microscope (AFM). Alignment of the scanning probe tip relative to the mark is then determined by visual observation of the microscope image. This alignment process may be repeated to improve positional accuracy, or to allow for modification or changing of the scanning probe microscope tip.

An embodiment of a method in accordance with the present invention for aligning a scanning probe, comprises, providing a substrate, applying a first beam of light on a surface of the substrate to form a registration mark, and applying a scanning probe microscope tip to the substrate. The scanning probe microscope tip is illuminated with a second beam of light, the substrate is imaged under an optical microscope, and at least one of a distance and direction between the illuminated scanning probe microscope tip and the registration mark is determined.

An embodiment of an apparatus for aligning a scanning probe on a surface of a substrate, comprises, a scanning probe microscope comprising a scanning probe tip, a first light source configured to illuminate the substrate to form a registration mark, and a second light source configured to illuminate the scanning probe tip when near to or in contact with the substrate surface. An optical microscope is in optical communication with the substrate and configured to show the illuminated scanning probe tip or its shadow or diffraction pattern and the registration mark in a single field of view.

An embodiment of a method in accordance with the present invention for fabricating a nanostructure on a substrate, comprises, providing a substrate, applying a first beam of light on a surface of the substrate to form a registration mark, and applying a scanning probe microscope tip to alter the substrate surface at a first location. The scanning probe microscope tip is one of changed and modified, and then illuminated with a second beam of light, and the substrate is imaged under an optical microscope. At least one of a distance and a direction between the illuminated modified or changed scanning probe microscope tip and the registration mark is determined. One of the modified and changed scanning probe microscope tip is applied to again alter the substrate surface at least one of a known distance and a known direction relative to the first location.

DETAILED DESCRIPTION OF THE INVENTION

To pattern a series of nanoscale sensors with highly accurate spatial patterning and highly specific functionality may require frequent modification (for example chemical or positional), and/or periodic replacement of the probe tip being used for writing or manipulating. Therefore, it is necessary to repeatedly return the probe to the same location on the substrate with an accuracy smaller than the size of the feature of interest, so that sequential patterning steps can be performed. Merely as an example, features patterned by DPN typically exhibit a linewidth of between about 30-70 nm. To bind a specific protein to a specific site on such a DPN-patterned line would thus require locating the probe to between 5 and 50 nm depending on the specifics of the device and of the patterning.

Embodiments in accordance with the present invention relate to methods and apparatuses for aligning a scanning probe, which may be used to pattern a substrate, with the substrate or specific features thereon, by optically comparing the position of the probe to a reference location or spot on the substrate. A first light beam is applied on a surface of the substrate as a spatial reference point. A second light beam then illuminates the scanning probe being used for patterning. An optical microscope images both the focused light beam and the diffraction pattern of the illuminated scanning probe tip of a scanning probe microscope (SPM), which is typically the tip of the scanning probe on an atomic force microscope (AFM). Alignment of the scanning probe tip relative to the reference mark or spot is then determined by computer analysis or visual observation of the microscope image. This alignment process may be repeated to improve position determination accuracy or to allow for modification and/or replacement of the scanning probe microscope tip.

Figure 2:
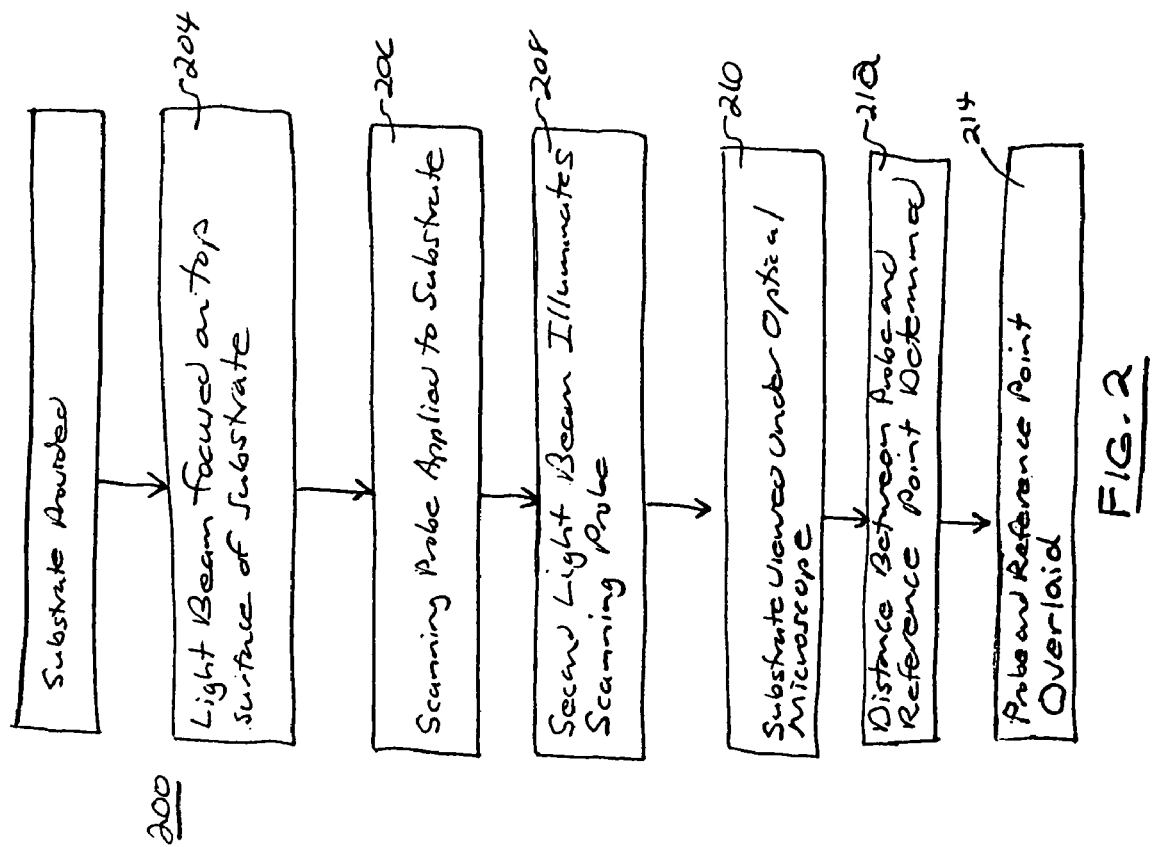
FIG. 2 presents a simplified process flow of an embodiment of a spatial registration method in accordance with the present invention.
Figure 1:
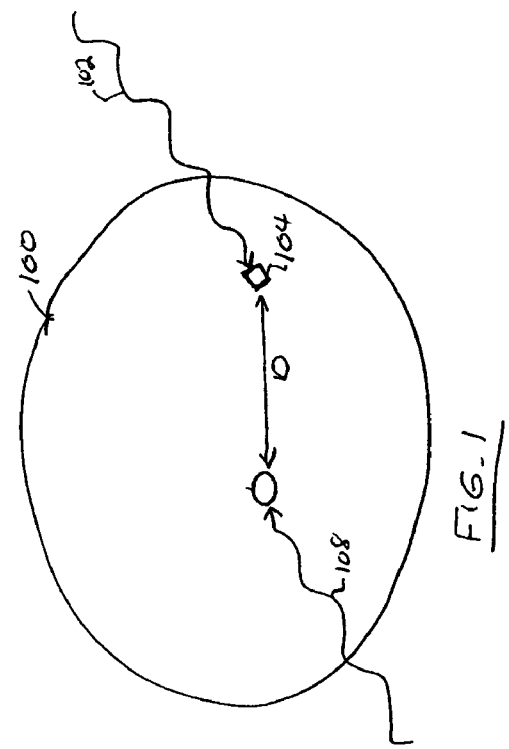
FIG. 1 shows a simplified schematic views of an embodiment of spatial registration in accordance with the present invention.

FIG. 1 shows a simplified schematic view of an embodiment of spatial registration in accordance with the present invention. FIG. 2 presents a simplified process flow of an embodiment of a spatial registration method in accordance with the present invention.

Specifically, in first step 202 of process flow 200, substrate 100 is provided. In second step 204 of process flow 200, a first light beam 102 is applied to a surface of the substrate 100, to create a registration mark 104.

In third step 206, scanning probe tip 106 is provided to the substrate 100. In fourth step 208, a second light beam illuminates the scanning probe 106. This illumination of the probe may create one or more optical effects. In accordance with one embodiment, illumination of the probe with near-monochromatic light may produce a diffraction pattern.

In accordance with another embodiment, illumination of the probe with polychromatic light may result in the probe tip casting a shadow. In accordance with yet another embodiment, illumination of the probe may result in the backscattering of light therefrom which may be detected.

In fifth step 210, the substrate is viewed under an optical microscope. This optical image includes a field of view incorporating both the reference mark and the result of interaction between the probe and the illuminating light source (i.e. a diffraction pattern, shadow, or backscattered light).

In sixth step 212, a distance d and direction between the illuminated scanning probe tip 106 and the registration mark 104 is determined, thereby permitting alignment/registration. The position of the probe relative to the mark may be determined visually using the microscope image by aligning the probe near to or on top (overlying) the reference mark, in a single step or by a succession of steps.

In accordance with still other embodiments, this probe-mark alignment can be performed analytically, computing a specific or central location of the probe and/or the reference mark. Such analytic computation could be performed using a pattern template or mask to more accurately determine the center of the reference mark and scattered light, diffraction pattern, or shadow cast by the illuminated probe. Using the microscopic image, the distance and direction between the calculated positions of the reference mark and the probe can be determined.

As shown in an optional seventh step 214, in order to verify the relative positions of the mark and probe tip, the probe can be moved in one or a succession of steps until the probe and reference marks are located at the same position (superimposed). In an alternate embodiment, the reference mark can be moved in one or a succession of steps until the probe and reference marks are located at the same position.

In accordance with still other embodiments of the present invention, an initial or subsequent iterative determination of the position of the probe relative to the substrate could be performed automatically by a processor. The process of aligning the probe on a substrate could thus be performed partially or even entirely autonomously by a computer.

Once the position of the probe has been established relative to the reference mark, the probe can be manipulated to any location on the substrate and its position can be known using the change in coordinates as defined by the SPM control electronics. Such movement, or a succession of such movements, can be made and the position of the probe will be known using the above process. Using this technique, a defined pattern of movements and/or actions can be accomplished or repeated.

Finally, where the scanning microscope probe tip is to be modified or changed in order to fabricate a nanostructure, the above process for aligning the tip to the registration mark, may be repeated. Alternately, the above process for aligning the tip to the registration mark can also be used to eliminate uncertainty arising from sources such as a succession of movements, thermal drift, or other sources.

Embodiments in accordance with the present invention thus describe a set of techniques which enable the manufacture of a variety of nanoscale devices and sensors through chemical patterning. Furthermore, these techniques enable the devices to be manufactured at a specific location. Additionally these techniques enable a variety of such devices to be combined or patterned with high spatial accuracy.

In accordance with certain embodiments, the SPM or AFM probe being used for patterning can be illuminated with a laser pointer or other source of near-monochromatic light to produce a clearly defined diffraction pattern. This diffraction pattern can be imaged by the optical microscope objective when this probe is in contact with, or very close to, the transparent or semitransparent substrate.

Figure 3A:
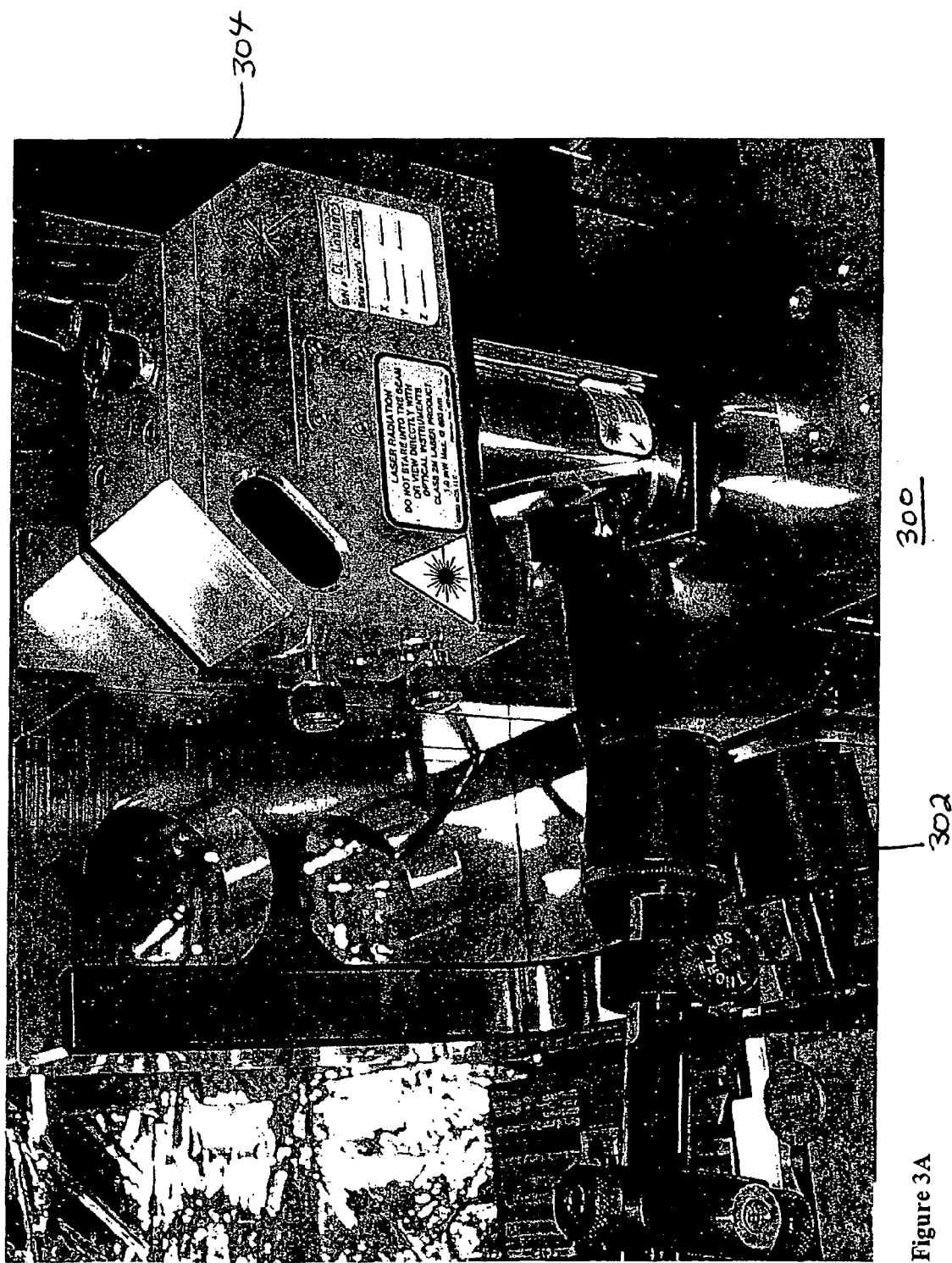
FIG. 3A shows in photograph of an assembled hybrid AFM/Inverted Optical microscope with single molecule sensitivity utilizing a laser pointer to illuminate the AFM probe tip.
Figure 3B:
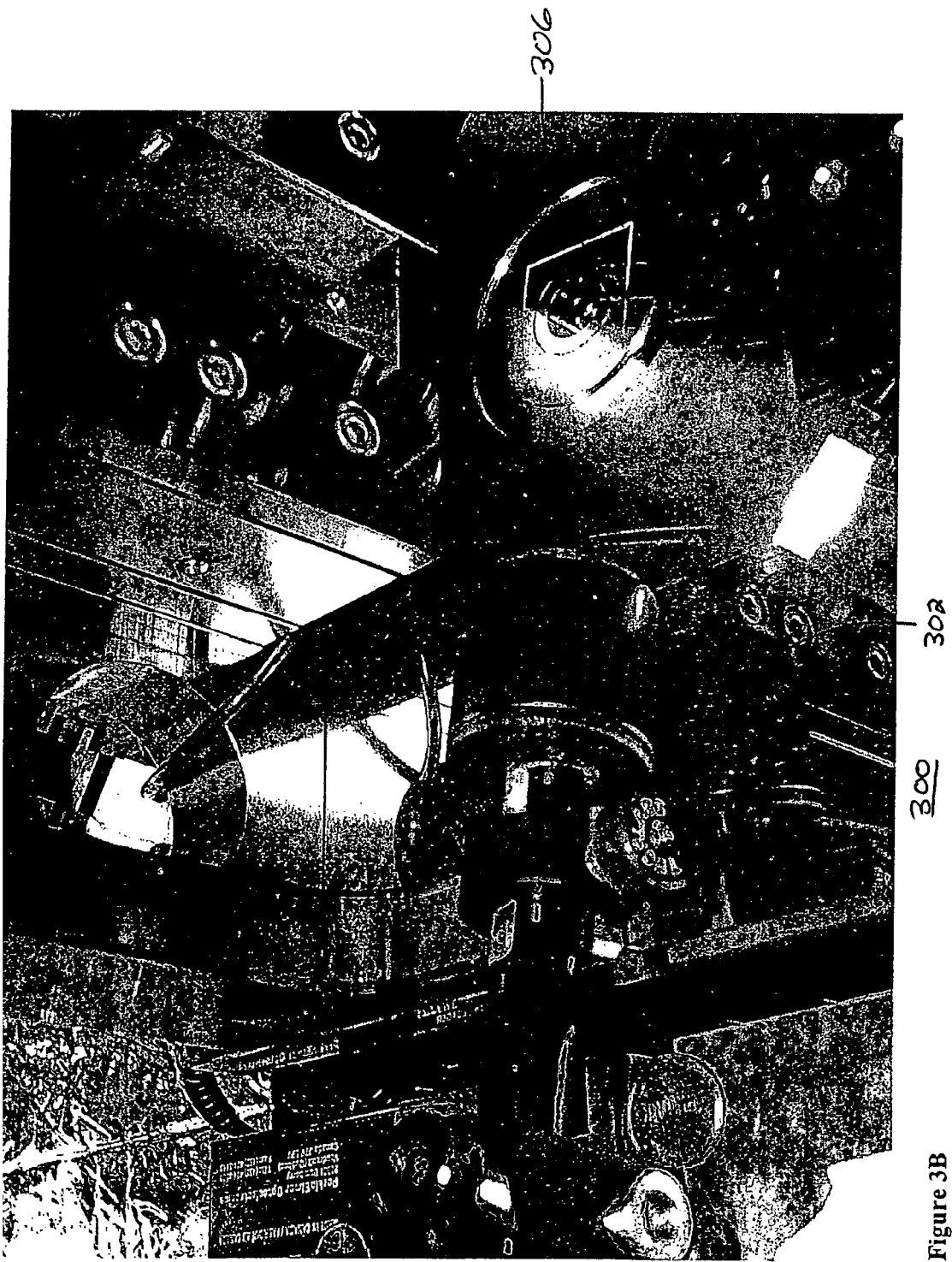
FIG. 3B shows a photograph of the same microscope without the AFM head.

FIGS. 3A-B show photographs of an embodiment of an apparatus for use in accordance with the present invention. FIG. 3A shows an assembled hybrid AFM/Inverted Optical microscope 300 with single molecule sensitivity. Here, the SPM is a Veeco Instruments closed-loop BioScope AFM with NanoScope IV controller. A laser pointer 302 is used to illuminate the AFM probe tip.

FIG. 3B shows the microscope 300 of FIG. 3A without the AFM head. In FIG. 3B, a 543 nm HeNe laser is focused on the top surface of the cover slip 306 by the 1.45 NA microscope objective, here a 1.45 NA Olympus oil-emersion objective.

Figure 4B:
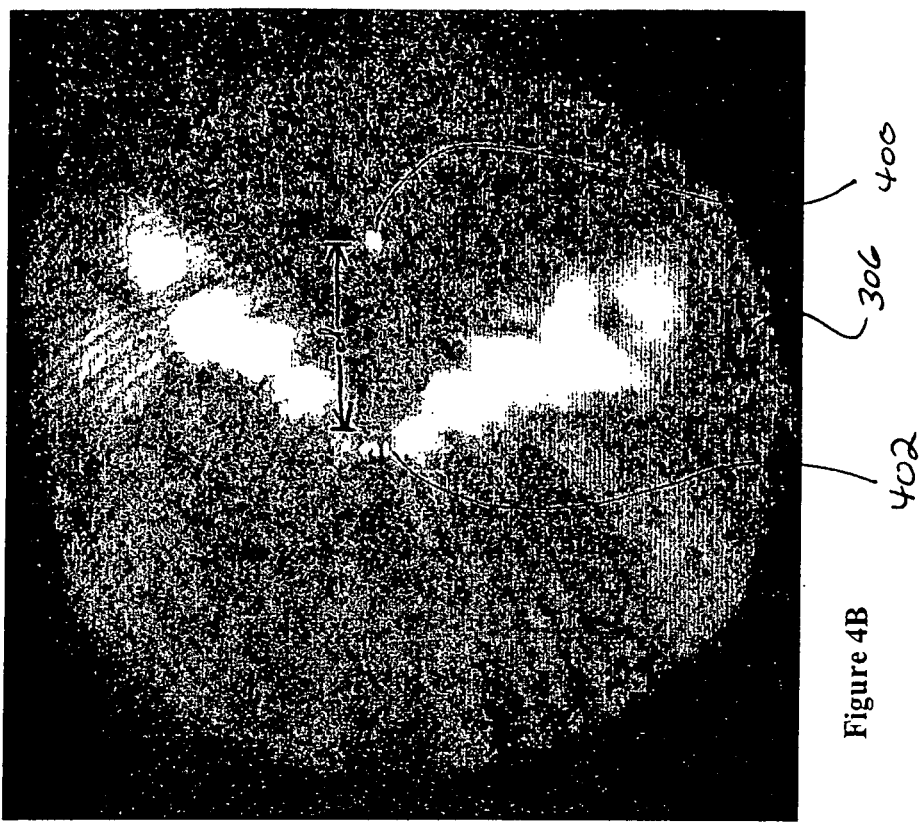
FIGS. 4A-D show optical micrographs illustrating various steps of a spatial registration method utilizing the apparatus of FIGS. 3A-B.
Figure 4A:
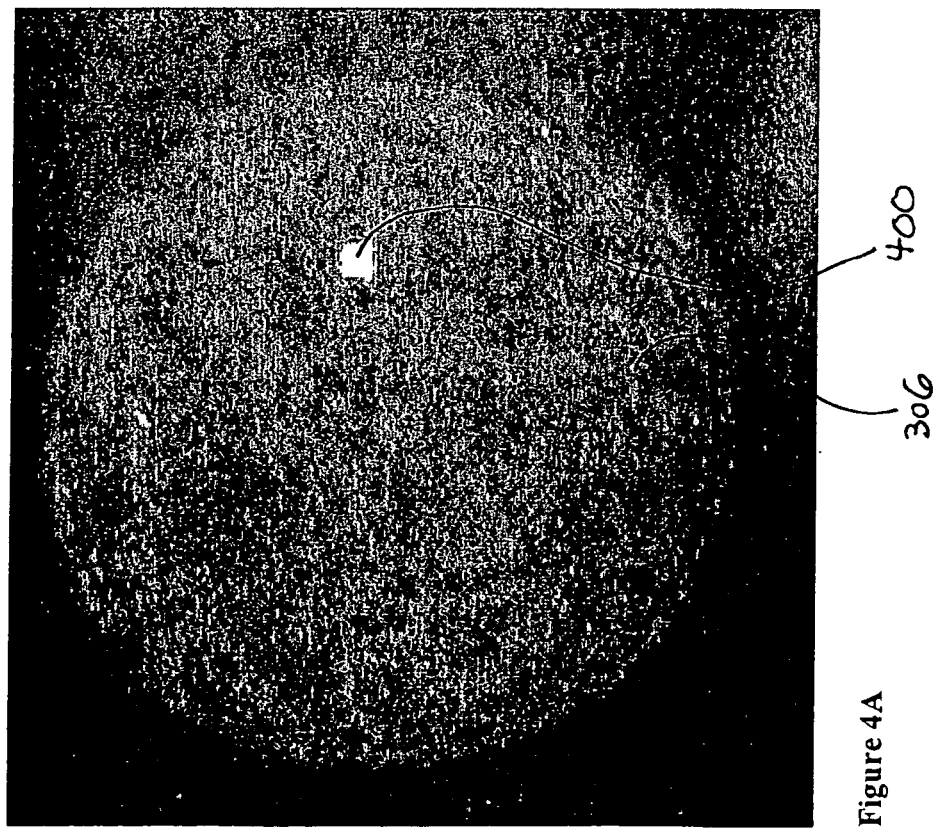

FIGS. 4A-D show optical micrographs illustrating various steps of a spatial registration method performed utilizing the apparatus of FIGS. 3A-B. Specifically, FIG. 4A shows the microscope image of the reflected 543 nm reference laser spot 400 and the top surface of the glass cover slip 306 when illuminated by the laser pointer of FIG. 3A.

FIG. 4B shows the diffraction pattern 402 cast by the tip of the AFM probe when <50 nm off the cover slip surface under illumination from the laser pointer. The 543 nm reference spot 400 (seen to the left of this diffraction pattern) is located at a distance d of approximately 9 µm and the direction indicated, from the probe tip.

Figure 4D:
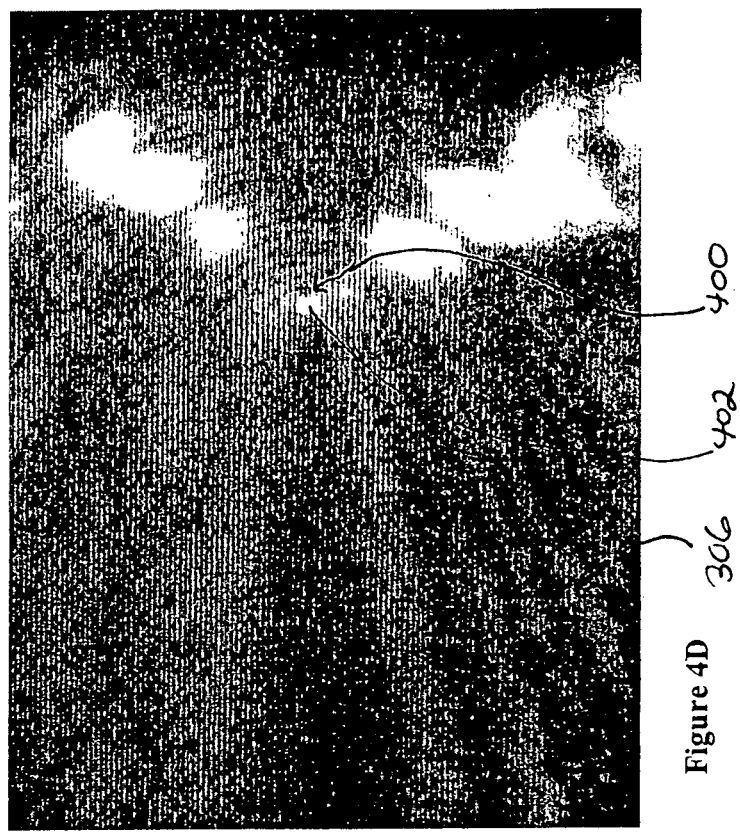
Figure 4C:
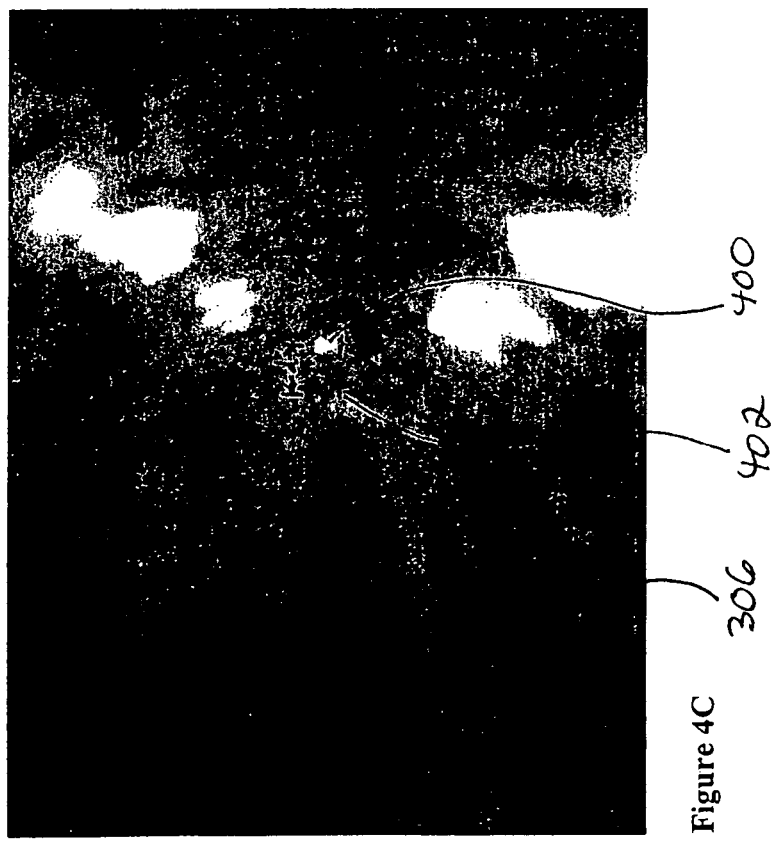

FIG. 4C shows the diffraction pattern 402 (left of the reference location 400 by distance d) is 1.45 µm in X and 450 nm in Y from the reference spot 400. In FIG. 4D, the diffraction pattern 402 is aligned with the reference spot 400 to <30 nm.

As seen in FIGS. 4B-D, by comparing the relative positions of the reference laser spot and the probe diffraction pattern as imaged by the microscope objective, the AFM probe may consistently be positioned close to the reference spot. In other embodiments, the probe position was less than 200 nm from the center of the reference location. In yet another embodiment the probe was able to be positioned as close as $\lambda/10$ or approximately 60 nm. In still another embodiment, this location is within $\lambda/30$ or approximately 20 nm. In another embodiment, the probe and the reference location center were able to be aligned to <10 nm.

Utilizing a diffraction pattern allows reliable repeated alignment to better than 1/20 of a fringe. Given that the fringes of the reference spot diffraction pattern are ~½ of a wavelength, this equates to 600 nm/2/20=15 nm (plus or minus). With more precise centroid interpolation software, alignment can be reduced by another factor of 5 to ~+/−3 nm.

Having performed the alignment as shown above, the writing probe can then readily revisit any location within its field-of-view (FoV). In one embodiment the FoV is as much as 100 µm. In another embodiment this FoV could be as little as less than 10 µm or 1 mm.

In the embodiment of FIGS. 3A-4D, the SPM is a Veeco Instruments closed-loop BioScope AFM with NanoScope IV controller. However, other types of scanning probe instruments or microscopes can be used.

Also in the embodiment of FIGS. 3A-4D, the microscope objective is a 1.3 or 1.45 NA 100× Olympus oil-emersion objective. However, the present invention is not limited to this particular device, and nearly any light focusing microscope objective could be used for this purpose.

Further, in the particular embodiment shown in FIGS. 3A-4D, the light beam employed to mark the substrate reference spot is a collimated 543 nm laser. However, the present invention is not limited to this particular type of light. In accordance with alternative embodiments, the reference spot may be created by focusing any type of laser beam or other light source. In accordance with still other embodiments of the present invention, the light beam may be supplied by a laser or diode-based device or a light source such as from a lamp where the light beam may be confined to a narrow range of wavelengths (e.g. 5 nm bandwidth, or 20 nm bandwidth, or 50 nm bandwidth), for example by use of a filter.

In accordance with still other embodiments of the present invention, the probe location may be illuminated by focusing a source of light other than a laser or laser pointer, for example a broadbeam light source such as from a lamp. In such a lamp-based embodiment, illumination of the probe may produce a well-defined shadow (diffraction pattern) that can be imaged. In addition, the probe may be illuminated by a freely propagating light beam, or a confined light beam such as provided by an optical fiber.

As just described, in accordance with certain embodiments, the substrate may be transparent or semi-transparent. In such embodiments, a light beam may be focused on the top surface of a substrate from underneath using a microscope objective in order to create a reference location or pattern.

However, while the above description has focused upon an embodiment in which the substrate being patterned by the probe exhibits some transparency, this is not required by the present invention. In accordance with alternative embodiments of the present invention, a small mark or particle may be used as the reference spot. In such an embodiment, the substrate need not have any transparency. The probe is illuminated as described above and the reference spot and the probe are imaged with a microscope objective located above the substrate. The reference spot and the probe are then aligned.

In accordance with still additional embodiments of the present invention, the reference location can be established by focusing a laser or other light beam on the substrate with optics mounted on the same side that the probe is on. In one such embodiment, these same optics can also be used both to image the probe and the reference locations.

In certain applications, the probe being aligned in accordance with embodiments of the present invention may comprise a nanostructure device, or molecular assembly, that is attached to a SPM. In another application, the probe that is being aligned according to the present invention being may comprise a nanostructure device, or molecular assembly, that is attached to an AFM.

Embodiments in accordance with the present invention enables construction and patterning of a wide variety of novel nanometerscale devices on a substrate. Such devices can find wide use in the fields of nanotechnology, materials science, and biophysics. Devices fabricated in accordance with embodiments of the present invention can be used for a variety of purposes, such as characterizing molecular conformations, chemical dynamics/behavior, intermolecular dynamics, and a wide variety of materials and devices at nanometer length scales. Potential applications for characterization or manipulation include biological systems and devices.

In addition, embodiments in accordance with the present invention can enable sequential or patterned construction of nanoscale DNA, protein and other sensing arrays. Embodiments in accordance with the present invention can enable the manufacture of nanoscale devices, including molecular circuits and other logic and sensing devices, through sequential patterning of chemicals and materials with different functionalities with high registration accuracy.

It is understood that the examples and embodiments described herein are for illustrative purposes only, and there can be other variations and alternatives. Various modifications or changes in light of the above description thereof will be suggested to persons skilled in the art and are to be included within the spirit and purview of this application and scope of the appended claims.

What is claimed is:

1. A method of aligning a scanning probe, the method comprising:
   providing a substrate;
   applying a first beam of light to form a registration mark on a surface of the substrate;
   applying a scanning probe microscope tip to the substrate;
   illuminating the scanning probe microscope tip with a second beam of light;
   imaging the substrate under an optical microscope; and
   determining at least one of a distance or a direction between a point on the surface of the substrate underlying the illuminated scanning probe microscope tip and the registration mark.

2. The method of claim 1 wherein the probe comprises a probe tip of an atomic force microscope.

3. The method of claim 1 wherein the first beam of light is applied to one of a same side of the substrate as the scanning probe microscope tip or an opposite side of the substrate as the scanning probe microscope tip.

4. The method of claim 1 wherein the second beam of light comprises light from one of a laser pointer and a laser diode, such that interaction between the scanning probe tip and the second laser beam creates a diffraction pattern having fringes.

5. The method of claim 1 wherein the second beam of light comprises light focused from a lamp, such that interaction between the scanning probe tip and the focused lamp light creates a shadow.

6. The method of claim 1 further comprising overlying the registration mark and one of light scattered by the illuminated probe tip, a diffraction pattern cast by the illuminated probe tip, or a shadow cast by the illuminated probe tip.

7. The method of claim 1 wherein the determining comprises computing a location of at least one of the mark or the illuminated probe tip relative to a diffraction pattern template.

8. A method of fabricating a nanostructure on a substrate, the method comprising:
   providing a substrate;
   applying a first beam of light to form a registration mark on a surface of the substrate;
   applying a scanning probe microscope tip to alter the substrate surface at a first location;
   modifying or changing the scanning probe microscope tip;
   illuminating the modified or changed scanning probe microscope tip with a second beam of light;
   imaging the substrate under an optical microscope;
   determining at least one of a distance or a direction between a point on the substrate underlying the illuminated modified or changed scanning probe microscope tip and the registration mark; and
   applying the modified or changed scanning probe microscope tip to again alter the substrate surface at a known distance or a known direction relative to the first location.

9. The method of claim 8 wherein the substrate surface is again altered at the first location.

10. The method of claim 8 wherein the modified or changed scanning probe microscope tip is illuminated with a laser to form a diffraction pattern including fringes.

11. The method of claim 8 wherein the determining comprises computing a location of one of the mark or the illuminated probe tip relative to a pattern template.

12. The method of claim 11 wherein the location of the illuminated probe is computed relative to a centroid of the pattern template.

* * * * *